United States Patent
Miura et al.

(10) Patent No.: US 12,515,998 B2
(45) Date of Patent: Jan. 6, 2026

(54) CERAMIC JOINED BODY, ELECTROSTATIC CHUCK DEVICE, AND METHOD FOR PRODUCING CERAMIC JOINED BODY

(71) Applicant: SUMITOMO OSAKA CEMENT CO., LTD., Tokyo (JP)

(72) Inventors: Yukio Miura, Tokyo (JP); Nobuhiro Hidaka, Tokyo (JP); Jun Arikawa, Tokyo (JP); Hironori Kugimoto, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 844 days.

(21) Appl. No.: 17/789,979

(22) PCT Filed: Dec. 28, 2020

(86) PCT No.: PCT/JP2020/049102
§ 371 (c)(1),
(2) Date: Jun. 29, 2022

(87) PCT Pub. No.: WO2021/153145
PCT Pub. Date: Aug. 5, 2021

(65) Prior Publication Data
US 2022/0388914 A1 Dec. 8, 2022

(30) Foreign Application Priority Data

Jan. 31, 2020 (JP) ................................ 2020-015794

(51) Int. Cl.
C04B 37/00 (2006.01)
C04B 35/117 (2006.01)
(Continued)

(52) U.S. Cl.
CPC .......... C04B 37/005 (2013.01); C04B 35/117 (2013.01); C04B 35/565 (2013.01);
(Continued)

(58) Field of Classification Search
None
See application file for complete search history.

(56) References Cited

U.S. PATENT DOCUMENTS

2002/0044404 A1\* 4/2002 Kosakai ............. H01L 21/6833
361/234
2010/0002354 A1\* 1/2010 Inazumachi ........... H02N 13/00
361/234
2014/0376148 A1 12/2014 Sasaki et al.

FOREIGN PATENT DOCUMENTS

JP 2000-239074 A 9/2000
JP 2003-152064 A 5/2003
(Continued)

OTHER PUBLICATIONS

International Search Report for PCT/JP2020/049102 (Apr. 6, 2021).
(Continued)

*Primary Examiner* — Kim S. Horger
(74) *Attorney, Agent, or Firm* — Merchant & Gould P.C

(57) ABSTRACT

A ceramic joined body (1) includes: a pair of ceramic plates (2,3) that include a conductive material; and a conductive layer (4) and an insulating layer (5) that are interposed between the pair of ceramic plates (2, 3), a porosity at an interface between the pair of ceramic plates (2, 3) and the insulating layer (5) is 4% or less, and a ratio of an average primary particle diameter of an insulating material which forms the insulating layer (5) to an average primary particle diameter of an insulating material which forms the ceramic plates (2, 3) is more than 1.

10 Claims, 2 Drawing Sheets

(51) Int. Cl.
*C04B 35/565* (2006.01)
*C04B 41/50* (2006.01)
*C04B 41/87* (2006.01)
*C04B 41/89* (2006.01)
*H01L 21/683* (2006.01)

(52) U.S. Cl.
CPC ...... *C04B 41/5031* (2013.01); *C04B 41/5057* (2013.01); *C04B 41/87* (2013.01); *C04B 41/89* (2013.01); *H01L 21/6833* (2013.01); *C04B 2235/3217* (2013.01); *C04B 2235/3826* (2013.01); *C04B 2235/3839* (2013.01); *C04B 2237/064* (2013.01); *C04B 2237/083* (2013.01); *C04B 2237/343* (2013.01); *C04B 2237/365* (2013.01); *C04B 2237/72* (2013.01)

(56) References Cited

FOREIGN PATENT DOCUMENTS

| | | |
|---|---|---|
| JP | 2007-051045 A | 3/2007 |
| JP | 2010-114416 A | 5/2010 |
| WO | 2013/118781 A1 | 8/2013 |

OTHER PUBLICATIONS

Japanese Office Action for Application No. 2020-015794 (Mar. 26, 2021).

\* cited by examiner

CERAMIC JOINED BODY, ELECTROSTATIC CHUCK DEVICE, AND METHOD FOR PRODUCING CERAMIC JOINED BODY

TECHNICAL FIELD

The present invention relates to a ceramic joined body, an electrostatic chucking device, and a method for producing a ceramic joined body.

This application is a National Stage Application of PCT/JP2020/049102, filed Dec. 28, 2020, which claims benefit of priority to Japanese Patent Application No. 2020-015794 filed on Jan. 31, 2020, the content of which is incorporated herein by reference. To the extent appropriate, a claim of priority is made to each of the above disclosed applications.

BACKGROUND ART

In the related art, in a semiconductor production step of producing a semiconductor device such as IC, LSI, or VLSI, a plate-shaped sample such as a silicon wafer is fixed to an electrostatic chuck member having an electrostatic chuck function by electrostatic adsorption, and a predetermined process is performed thereon.

When the plate-shaped sample is etched, for example, in a plasma atmosphere, a surface of the plate-shaped sample is heated to a high temperature by heat of the plasma, and there may be a problem in that, for example, a resist film of the surface is burst.

Here, in order to maintain the temperature of the plate-shaped sample at a desired given temperature, an electrostatic chucking device is used. The electrostatic chucking device includes an electrostatic chuck member and a base member for adjusting a temperature. On a bottom surface of the electrostatic chuck member, the base member for adjusting a temperature where a flow path that circulates a coolant for controlling a temperature to the inside of a metal member is formed is joined and integrated through a silicone adhesive.

In this electrostatic chucking device, the coolant for adjusting a temperature is circulated for heat exchange to the flow path of the base member for adjusting a temperature. That is, various plasma treatments are performed on the plate-shaped sample by performing electrostatic adsorption while maintaining the temperature of the plate-shaped sample fixed to a top surface of the electrostatic chuck member at a desired given temperature.

Incidentally, corrosion resistance, heat resistance, plasma resistance, durability to a load of heat cycle, and the like are required for the electrostatic chuck member of the electrostatic chucking device. As a member that realizes the electrostatic chucking device where the performance is excellent, an electrostatic chuck member is known including: an electrostatic chuck base body that is formed of a composite dielectric ceramic obtained by adding a conductive material to an insulating ceramic material; an internal electrode that is built in the electrostatic chuck base body; and a power feeding terminal that is provided in contact with the internal electrode (for example, refer to Patent Literatures Nos. 1 and 2).

CITATION LIST

Patent Literature

[Patent Literature No. 1] Japanese Laid-open Patent Publication No. 2003-152064

[Patent Literature No. 2] Japanese Laid-open Patent Publication No. 2007-051045

SUMMARY OF INVENTION

Technical Problem

A material of the internal electrode in the electrostatic chuck electrode-built susceptor described in Patent Literature Nos. 1 and 2 is not particularly limited. This material is a high melting point material having high conductivity and may be a composite sintered compact including an insulating ceramic material and a conductive high melting point material. Joint surfaces of the composite dielectric ceramic of the electrostatic chuck base body and the internal electrode are joined generally after being polished. Therefore, the conductive material is exposed on each of the surfaces at the joint interface between the electrostatic chuck base body and the internal electrode. Therefore, at the interface between the electrostatic chuck base body and the internal electrode (conductive layer), a conductive path is likely to be formed such that the insulating characteristics are low. Accordingly, there is a problem in that breakdown (discharge) occurs at the joint interface between the composite dielectric ceramic and the internal electrode.

The present invention has been made in consideration of the above-described circumstances, and an object thereof is to provide a ceramic joined body in which the occurrence of breakdown (discharge) is suppressed at a joint interface between a ceramic plate and a conductive layer, an electrostatic chucking device including the ceramic joined body, and a method for producing the ceramic joined body.

Solution to Problem

In order to achieve the above-described object, according to a first aspect of the present invention, there is provided a ceramic joined body including: a pair of ceramic plates that include a conductive material; and a conductive layer and an insulating layer that are interposed between the pair of ceramic plates, in which a porosity at an interface between the pair of ceramic plates and the insulating layer is 4% or less, and a ratio of an average primary particle diameter of an insulating material which forms the insulating layer to an average primary particle diameter of an insulating material which forms the ceramic plate is more than 1.

It is also preferable that the first aspect of the present invention has the following characteristics. Two or more of the following characteristics may be combined with each other.

In the first aspect of the present invention, the conductive layer may be formed of a conductive material and an insulating material, and the insulating layer may be formed of an insulating material.

In the first aspect of the present invention, an average primary particle diameter of the insulating material which forms the insulating layer may be 1.6 μm or more and 10.0 μm or less.

In the first aspect of the present invention, the ceramic plate may be formed of a composite body of aluminum oxide and silicon carbide.

In the first aspect of the present invention, the insulating materials which are included in the conductive layer and the insulating layer may consist of aluminum oxide.

In the first aspect of the present invention, the conductive material which is included in the conductive layer may be at least one selected from the group consisting of Mo$_2$C, Mo, WC, W, TaC, Ta, SiC, carbon black, carbon nanotubes, and carbon nanofibers.

According to a second aspect of the present invention, there is provided an electrostatic chucking device, in which an electrostatic chuck member formed of a ceramic and a base member for adjusting a temperature formed of a metal are joined through an adhesive layer, and the electrostatic chuck member is formed of the ceramic joined body according to the first aspect of the present invention.

According to a third aspect of the present invention, there is provided a method for producing a ceramic joined body, the method including: a step of preparing a first ceramic plate including a conductive material and a second ceramic plate including a conductive material; a step of adjusting an arithmetic average roughness (Ra) of one surface of the first ceramic plate to be 0.25 µm or less by grinding or polishing the one surface of the first ceramic plate; a step of applying a paste for forming a conductive layer to the processed one surface of the first ceramic plate to form a conductive layer coating film; a step of applying a paste for forming an insulating layer to the processed one surface of the first ceramic plate to form an insulating layer coating film; a step of adjusting an arithmetic average roughness (Ra) of one surface of the second ceramic plate to be 0.25 µm or less by grinding or polishing the one surface of the second ceramic plate; a step of laminating the second ceramic plate on the conductive layer coating film and the insulating layer coating film so that the processed one surface of the second ceramic plate is in contact with surfaces of the conductive layer coating film and the insulating layer coating film, wherein the surfaces of the films are located on a side opposite to surfaces of the films which are in contact with the first ceramic plate; and a step of pressurizing a laminate including the first ceramic plate, the conductive layer coating film, the insulating layer coating film, and the second ceramic plate in a thickness direction while heating the laminate.

With the production method according to the third aspect, the ceramic joined body according to the first aspect can be preferably produced.

Advantageous Effects of Invention

According to the present invention, it is possible to provide a ceramic joined body in which the occurrence of breakdown (discharge) is suppressed at a joint interface between a ceramic plate and a conductive layer, an electrostatic chucking device including the ceramic joined body, and a method for producing the ceramic joined body.

DESCRIPTION OF EMBODIMENTS

Preferable examples of embodiments of a ceramic joined body, an electrostatic chucking device, and a method for producing a ceramic joined body according to the present invention will be described.

The embodiment will be described in detail for easy understanding of the concept of the present invention, but the present invention is not limited thereto unless specified otherwise. Within a range not departing from the scope of the present invention, changes, omissions, or additions can be made for a number, a position, a size, a numerical value, a ratio, a material, or the like.

[Ceramic Joined Body]

First Embodiment

Hereinafter, a preferable example of a ceramic joined body according to one embodiment of the present invention will be described with reference to FIG. 1.

In all of the following drawings, dimensions, ratios, and the like of the components may be appropriately different from the actual ones in order to easily understand the drawings.

Figure 1:
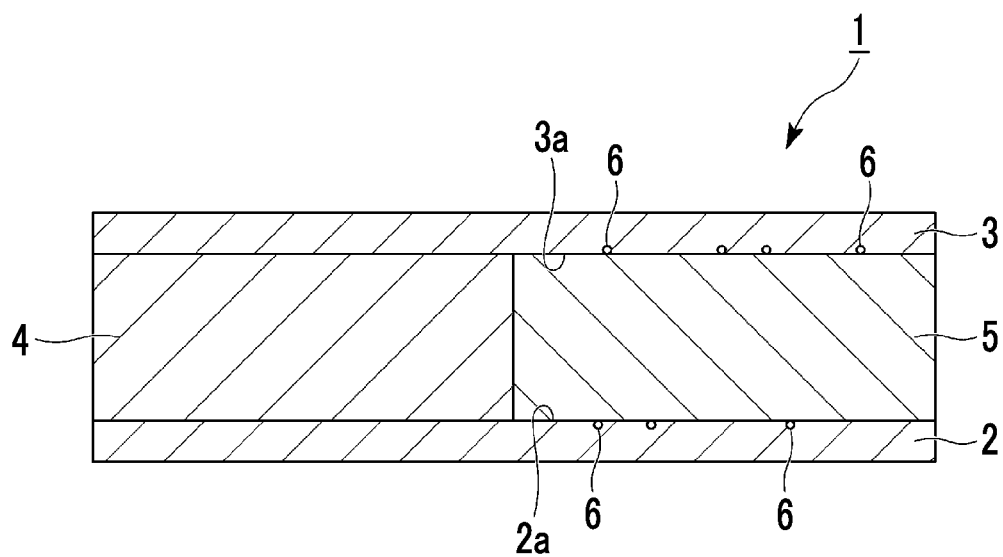
FIG. 1 is a schematic cross-sectional view showing an example of a ceramic joined body according to one preferable embodiment of the present invention.

As shown in FIG. 1, in the ceramic joined body 1, the first ceramic plate 2, a combination of the conductive layer 4 and the insulating layer 5, and the second ceramic plate 3 are laminated in this order from the lower side in the drawing. That is, the ceramic joined body 1 is a joined body in which the first ceramic plate 2 and the second ceramic plate 3 are joined and integrated through the conductive layer 4 and the insulating layer 5. In the drawing, the insulating layer 5 is disposed on an outer periphery of the conductive layer 4. An interface between the conductive layer 4 and the insulating layer 5 is also in contact with the first ceramic plate 2 and the second ceramic plate 3 that are disposed above and below conductive layer 4 and the insulating layer 5.

As shown in FIG. 1, pores 6 are present at an interface between the first ceramic plate 2 and the insulating layer 5 and an interface between the second ceramic plate 3 and the insulating layer 5. At the interface between the first ceramic plate 2 and the insulating layer 5 and the interface between the second ceramic plate 3 and the insulating layer 5, a porosity is preferably 4% or less and preferably 3% or less. The porosity is more preferably 2% or less. When the porosity is more than 4%, the occurrence of breakdown (discharge) cannot be suppressed at a joint interface between the ceramic plates 2 and 3 and the conductive layer 4. The lower limit of the porosity can be freely selected and is, for example, preferably 0.1% or more, still more preferably 0.3% or more, and still more preferably 0.5% or more. However, the porosity is not limited to only this example.

A method for measuring the porosity at the interface between the first ceramic plate 2 and the insulating layer 5 and the interface between the second ceramic plate 3 and the insulating layer 5 can be measured using a method described below. First, the ceramic joined body 1 is cut in a thickness direction. Using a field emission scanning electron microscope (FE-SEM), for example, a field emission scanning electron microscope manufactured by JEOL Ltd., a cut surface of the first ceramic plate 2, the second ceramic plate 3, and the insulating layer 5 in the thickness direction is observed. An image of the cut surface is analyzed by image analysis software, for example, image analysis software (Mac-View Version 4, manufactured by MOUNTECH Co., Ltd.) to calculate the area of the pores 6. Based on the calculation result, the porosity (%) is calculated from the following Expression (1) using the area of the insulating layer 5 and the area of the pores 6. A measurement region of the image may be set, for example, as follows.

Measurement region: 360 µm×480 µm (region of insulating layer 5: 15 µm×480 µm, region of ceramic plate 3: 345 µm×480 µm)

The measurement region is a region where the second ceramic plate 3 and the insulating layer 5 are in contact with each other. In addition, for the each of the areas used in Expression (1), the above-described area or the porosity verified in the above-described area may be used.

Porosity=Area of Pores/(Area of Insulating Layer+ Area of Pores)×100    (1)

The first ceramic plate 2, the second ceramic plate 3, and the insulating layer 5 are formed of insulating materials as described below. A ratio of an average primary particle diameter of an insulating material forming the insulating layer 5 to an average primary particle diameter of an insulating material forming the first ceramic plate 2 and the second ceramic plate 3 ((Average Primary Particle Diameter of Insulating Material forming Insulating Layer 5)/(Average Primary Particle Diameter of Insulating Material forming First Ceramic Plate 2 and Second Ceramic Plate 3) is more than 1 and is preferably 1.3 or more. Further, the ratio is more preferably 2.2 or more. When the ratio is less than 1, the occurrence of breakdown (discharge) cannot be suppressed at the joint interface between the ceramic plates 2 and 3 and the conductive layer 4. The upper limit of the ratio can be freely selected may be, for example, 10 or less or 7 or less. However, the upper limit is not limited to only these examples. For example, the ratio may be 2 to 6, 3 to 5, or 4 to 8.

It is preferable that shapes of overlapping surfaces of the first ceramic plate 2 and the second ceramic plate 3 are the same. The shape of the ceramic plate can be freely selected, and may be, for example, a circular shape, a donut shape, a square shape, or a rectangular shape but is not limited to only these examples.

The thicknesses of the first ceramic plate 2 and the second ceramic plate 3 can be freely selected without any particular limitation and can be appropriately adjusted depending on the use of the ceramic joined body 1. For example, the thicknesses may be 0.3 to 3.0 mm, 0.4 to 0.5 mm, or 0.5 to 1.5 mm but is not limited to only these examples. The thicknesses of the ceramic plates 2 and 3 may be the same as or different from each other.

The first ceramic plate 2 and the second ceramic plate 3 have the same composition or the same major component. That is, the first ceramic plate 2 and the second ceramic plate 3 may have the same composition or may have different compositions. The first ceramic plate 2 and the second ceramic plate 3 are formed of a composite body of an insulating material and a conductive material. It is preferable that the composite body consists of only an insulating material and a conductive material. The insulating material in the first ceramic plate 2 and the second ceramic plate 3 is not particularly limited, and examples thereof include at least one selected from aluminum oxide ($Al_2O_3$), aluminum nitride (AlN), yttrium oxide ($Y_2O_3$), yttrium-aluminum-garnet (YAG), and the like. In addition, the conductive material in the first ceramic plate 2 and the second ceramic plate 3 is not particularly limited, and examples thereof include at least one selected from silicon carbide (SiC), titanium oxide ($TiO_2$), titanium nitride (TiN), titanium carbide (TiC), carbon (C), carbon nanotubes (CNT), carbon nanofibers, rare earth oxide, rare earth fluoride, and the like.

The proportion of the insulating material in the composite body can be freely selected, is preferably 80% to 99% by mass and preferably 85% to 98% by mass, and is not limited to only these examples. The proportion may be, for example, 80% to 95% by mass or may be 83% to 90% by mass. The proportion of the conductive material in the composite body can be freely selected, is preferably 1% to 20% by mass and preferably 2% to 15% by mass, and is not limited to only these examples. The proportion may be, for example, 3% to 12% by mass or may be 5% to 10% by mass.

It is preferable that the material (composite body) of the first ceramic plate 2 and the second ceramic plate 3 has a volume specific resistance value of about $10^{13}$ Ω·cm or more and $10^{15}$ Ω·cm or less, has a mechanical strength, and has durability to corrosive gas and plasma thereof. Examples of the material include an aluminum oxide ($Al_2O_3$) sintered compact, an aluminum nitride (AlN) sintered compact, and an aluminum oxide ($Al_2O_3$)-silicon carbide (SiC) composite sintered compact. From the viewpoints of dielectric characteristics, high corrosion resistance, plasma resistance, and heat resistance at a high temperature, an aluminum oxide ($Al_2O_3$)-silicon carbide (SiC) composite sintered compact is preferable.

The average primary particle diameter of the insulating material forming the first ceramic plate 2 and the second ceramic plate 3 that is measured using a method described below is preferably 0.5 μm or more and 3.0 μm or less, more preferably 0.8 μm or more and 2.5 μm or less, and still more preferably 1.0 μm or more and 2.0 μm or less.

When the average primary particle diameter of the insulating material forming the first ceramic plate 2 and the second ceramic plate 3 is 0.5 μm or more and 3.0 μm or less, the first ceramic plate 2 and the second ceramic plate 3 that are dense, have high voltage endurance, and have high durability can be obtained.

The average primary particle diameter of the insulating material forming the first ceramic plate 2 and the second ceramic plate 3 is measured using the following measurement method. Using a field emission scanning electron microscope (FE-SEM), for example, a field emission scanning electron microscope manufactured by JEOL Ltd., a cut surface of the first ceramic plate 2 and the second ceramic plate 3 in the thickness direction is observed. In the observed cut surface, the average particle diameter of 200 particles of the insulating material is obtained as the average primary particle diameter using an intercept method. Primary particles of the insulating material observed with the FE-SEM are observed like equiaxial particles.

The conductive layer 4 is, for example, a layer that is used as an electrode for plasma generation that applies high frequency power to generate plasma for a plasma treatment, an electrode for an electrostatic chuck that generates charges and fixes a plate-shaped sample due to an electrostatic adsorption force, and/or a heater electrode that heats a plate-shaped sample by electric heating. The shape of the conductive layer 4 (the shape of the conductive layer 4 when seen in a plan view (when seen from a thickness direction)) or the size of the conductive layer 4 (the thickness or the area of the conductive layer 4 when seen in a plan view (when seen from a thickness direction)) is not particularly limited and is appropriately adjusted depending on the use of the ceramic joined body 1. The thickness of the conductive layer 4 may be, for example, 5 to 200 mm or 8 to 150 mm but is not limited to only these examples. The thickness may be 10 to 100 μm. The shape of the conductive layer 4 is freely selected or may be, for example, a circular shape, a donut shape, a square shape, or a rectangular shape in a plan view.

The conductive layer 4 is formed of a conductive material and an insulating material. It is preferable that the conductive layer 4 is formed of a conductive compound material consisting of only a conductive material and an insulating material.

It is preferable that the conductive material in the conductive layer 4 is at least one selected from the group consisting of molybdenum carbide ($Mo_2C$), molybdenum (Mo), tungsten carbide (WC), tungsten (W), tantalum carbide (TaC), tantalum (Ta), silicon carbide (SiC), carbon black, carbon nanotubes, and carbon nanofibers. The conductive material in the conductive layer 4 is formed of at least one selected from the group consisting of the above-described materials such that the conductivity of the conductive layer can be secured.

The insulating material in the conductive layer 4 is not particularly limited, and examples thereof include at least one selected from aluminum oxide ($Al_2O_3$), aluminum nitride (AlN), yttrium oxide ($Y_2O_3$), yttrium-aluminum-garnet (YAG), and the like. It is also preferable that the insulating material in the conductive layer 4 is the same as the insulating material of the first ceramic plate 2 and the second ceramic plate 3.

The conductive layer 4 is formed of a conductive material and an insulating material, and the joint strength of the first ceramic plate 2 and the second ceramic plate 3 and the mechanical strength as an electrode are strong. The insulating material in the conductive layer 4 is aluminum oxide ($Al_2O_3$) such that dielectric characteristics, high corrosion resistance, plasma resistance, and heat resistance at a high temperature are maintained.

A ratio (mixing ratio) between the contents of the conductive material and the insulating material in the conductive layer 4 is not particularly limited and is appropriately adjusted depending on the use of the ceramic joined body 1.

The proportion of the insulating material used in the conductive layer 4 can be freely selected, is preferably 25% to 65% by mass and preferably 35% to 55% by mass with respect to the total amount of the conductive material and the insulating material, and is not limited to only these examples. The proportion may be, for example, 30% to 60% by mass or 40% to 50% by mass.

The proportion of the conductive material used in the conductive layer 4 can be freely selected, is preferably 35% to 75% by mass and preferably 45% to 65% by mass with respect to the total amount, and is not limited to only these examples. The proportion may be, for example, 40% to 70% by mass or 50% to 60% by mass.

The insulating layer 5 is a layer that is provided for joining boundary portions of the first ceramic plate 2 and the second ceramic plate 3, that is, outer peripheral regions other than a portion where the conductive layer 4 is formed. The shape of the insulating layer 5 (the shape of the insulating layer 5 when seen in a plan view (when seen from the thickness direction) is not particularly limited and is appropriately adjusted depending on the shape of the conductive layer 4.

In the ceramic joined body 1 according to the embodiment, it is preferable that the thickness of the insulating layer 5 is the same as the thickness of the conductive layer 4. The shape of the insulating layer 5 is freely selected, may be, for example, a circular shape, a donut shape, a square shape, or a rectangular shape in a plan view, but is not limited to only these examples. The shape of the insulating layer 5 may be a shape surrounding the conductive layer 4 in a plan view.

The insulating layer 5 is formed of only an insulating material.

The insulating material forming the insulating layer 5 is not particularly limited and is preferably the same as the insulating material of the first ceramic plate 2 and the second ceramic plate 3. Examples of the insulating material forming the insulating layer 5 include at least one selected from aluminum oxide ($Al_2O_3$), aluminum nitride (AlN), yttrium oxide ($Y_2O_3$), yttrium-aluminum-garnet (YAG), and the like. It is preferable that the insulating material forming the insulating layer 5 consists of only aluminum oxide ($Al_2O_3$). The insulating material forming the insulating layer 5 is aluminum oxide ($Al_2O_3$) such that dielectric characteristics, high corrosion resistance, plasma resistance, and heat resistance at a high temperature are preferably maintained.

The average primary particle diameter of the insulating material forming the insulating layer 5 is preferably 1.6 μm or more and 10.0 μm or less, more preferably 1.6 μm or more and 8.0 μm or less, and still more preferably 1.6 μm or more and 6.0 μm or less. The value may be, for example, 1.6 to 2.5 μm, 2.5 to 3.5 μm, or 3.5 to 5.0 μm.

When the average primary particle diameter of the insulating material forming the insulating layer 5 is 1.6 μm or more, sufficient voltage endurance can be obtained. On the other hand, when the average primary particle diameter of the insulating material forming the insulating layer 5 is 10.0 μm or less, workability of grinding or the like is excellent.

A method for measuring the average primary particle diameter of the insulating material forming the insulating layer 5 is the same as the method for measuring the average primary particle diameter of the insulating material forming the first ceramic plate 2 and the second ceramic plate 3.

The ceramic joined body 1 according to the embodiment includes: the pair of ceramic plates 2 and 3 that include a conductive material; and the conductive layer 4 and the insulating layer 5 that are interposed between the ceramic plates 2 and 3, in which the porosity at the interface between the pair of ceramic plates 2 and 3 and the insulating layer 5 is 4% or less, and the ratio of the average primary particle diameter of the insulating material forming the insulating layer 5 to the average primary particle diameter of the insulating material forming the ceramic plates 2 and 3 is more than 1. Therefore, the occurrence of breakdown (discharge) can be suppressed at a joint interface between the ceramic plates 2 and 3 and the conductive layer 4.

[Method for Producing Ceramic Joined Body]

A method for producing the ceramic joined body according to the embodiment includes: a step of adjusting an arithmetic average roughness (Ra) of one surface of a first ceramic plate including a conductive material to be 0.25 μm or less by grinding or polishing the one surface of the first ceramic plate (hereinafter, referred to as "first step"); a step of applying a paste for forming a conductive layer to a ground or polished surface of the first ceramic plate to form a conductive layer coating film and applying a paste for forming an insulating layer to the ground or polished surface to form an insulating layer coating film (hereinafter, referred to as "second step"); a step of adjusting an arithmetic average roughness (Ra) of one surface of a second ceramic plate including a conductive material to be 0.25 μm or less by grinding or polishing the one surface of the second ceramic plate (hereinafter, referred to as "third step"); a step of laminating the second ceramic plate on the conductive layer coating film and the insulating layer coating film such that the polished or ground surface of the second ceramic plate is in contact with surfaces of the conductive layer coating film and the insulating layer coating film opposite to surfaces thereof in contact with the first ceramic plate (hereinafter, referred to as "fourth step"); and a step of pressurizing a laminate including the first ceramic plate, the conductive layer coating film, the insulating layer coating film, and the second ceramic plate in a thickness direction while heating the laminate (hereinafter referred to as "fifth step").

It is preferable that the conductive layer is in direct contact with and is interposed between the pair of ceramic plates, and it is preferable that the insulating layer is in direct contact with and is interposed between the pair of ceramic plates.

Hereinafter, the method for producing the ceramic joined body according to the embodiment will be described with reference to FIG. 1.

In the first step, the arithmetic average roughness (Ra) of at least one surface of the first ceramic plate 2, that is, a surface 2a facing the insulating layer 5 to be 0.25 μm or less by grinding or polishing the surface 2a of the first ceramic plate 2. Conditions of the grinding or polishing process can be freely selected.

The arithmetic average roughness (Ra) of the surface 2a of the first ceramic plate 2 is 0.25 μm or less, more preferably 0.23 μm or less, and still more preferably 0.20 μm or less. The arithmetic average roughness (Ra) is more preferably 0.1 μm or less. The arithmetic average roughness is not limited to only these examples. The lower limit value can be freely selected. For example, the arithmetic average roughness (Ra) is 0.005 μm or more and preferably 0.01 μm or more, but the lower limit value is not limited to only these examples.

The arithmetic average roughness (Ra) of the surface 2a of the first ceramic plate 2 is measured using a surface roughness meter, for example, a stylus type surface roughness meter manufactured by Tokyo Seimitsu Co., Ltd., according to JIS B 0601: 2013 "Geometrical Product Specifications (GPS)—Surface Texture: Profile Method—Terms, Definitions and Surface Texture Parameters".

By adjusting the arithmetic average roughness (Ra) of the surface 2a of the first ceramic plate 2 to be 0.25 μm or less, In the grinding or polishing process, it is preferable to use an abrasive grain having an appropriately selected particle diameter. As the particle diameter of the abrasive grain, for example, a particle diameter in a range of #200 to #4000 defined by the JIS standards is preferably used.

In the second step, the paste for forming a conductive layer is applied using a freely selected coating method such as a screen printing method to a predetermined position of the ground or polished surface 2a of the first ceramic plate 2 to form a coating film (conductive layer coating film) for forming the conductive layer 4.

As the paste for forming a conductive layer, a paste in which the conductive material and the insulating material for forming the conductive layer 4 are dispersed in a freely selected solvent is preferably used.

As the solvent in the paste for forming a conductive layer, for example, isopropyl alcohol is used. The proportion of the material in the paste for forming a conductive layer can be freely selected and is preferably 10% to 40% by mass and more preferably 20% to 30% by mass.

The average primary particle diameter of the conductive material is preferably 0.1 μm to 10 μm and more preferably 0.5 μm to 5 μm. The particle diameter may be optionally 0.3 to 6 μm, 1 to 8 μm, or 2 to 4 μm but is not limited to only these examples. The average primary particle diameter of the insulating material is preferably 0.01 μm to 10 μm and more preferably 1.0 μm to 10 μm. The particle diameter may be optionally 0.3 to 6 μm, 1 to 8 μm, or 2 to 4 μm but is not limited to only these examples.

In addition, in the second step, the paste for forming an insulating layer is applied using a freely selected coating method such as a screen printing method to a predetermined position of the ground or polished surface 2a of the first ceramic plate 2 to form a coating film (insulating layer coating film) for forming the insulating layer 5. The paste for forming a conductive layer and the paste for forming an insulating layer may overlap each other but preferably do not overlap each other. The paste for forming a conductive layer and the paste for forming an insulating layer may be formed side by side or may be in contact with each other.

As the paste for forming an insulating layer, a paste in which the insulating material for forming the insulating layer 5 is dispersed in a freely selected solvent is preferably used.

As the solvent in the paste for forming an insulating layer, for example, isopropyl alcohol is used. The proportion of the material in the paste for forming an insulating layer can be freely selected and is preferably 20% to 70% by mass and more preferably 30% to 50% by mass.

The paste for forming an insulating layer may be applied first, the paste for forming a conductive layer may be applied first, or the two pastes may be applied at the same time. Before or after drying the paste that is applied first, the next paste may be dried.

In the third step, as in the first step, the arithmetic average roughness (Ra) of at least one surface of the second ceramic plate 3, that is, a surface 3a facing the insulating layer 5 or the conductive layer 4 to be 0.25 μm or less by grinding or polishing the surface 3a of the second ceramic plate 3.

The arithmetic average roughness (Ra) of the surface 3a of the second ceramic plate 3 is 0.25 μm or less, more preferably 0.23 μm or less, and still more preferably 0.20 μm or less. In addition, the arithmetic average roughness (Ra) is more preferably 0.1 μm or less. The lower limit value can be freely selected. For example, the arithmetic average roughness (Ra) is 0.005 μm or more and preferably 0.01 μm or more, but the lower limit value is not limited to only these examples.

The second and third steps may or may not include a drying step of drying the applied paste to a desired state.

In the fourth step, the second ceramic plate 3 is laminated on the conductive layer coating film and the insulating layer coating film such that the polished or ground surface 3a of the second ceramic plate 3 is in contact with surfaces of the conductive layer coating film and the insulating layer coating film opposite to surfaces thereof in contact with the first ceramic plate 2.

In the fifth step, the laminate including the first ceramic plate 2, the coating film for forming the conductive layer 4, the coating film for forming the insulating layer 5, and the second ceramic plate 3 is pressurized in the thickness direction while being heated. The atmosphere in which the laminate is pressurized in the thickness direction while being heated is preferably a vacuum or an inert atmosphere such as Ar, He, or $N_2$.

A temperature (heat treatment temperature) at which the laminate is heated is freely selected and is preferably 1600° C. or higher and 1900° C. or lower and more preferably 1650° C. or higher and 1850° C. or lower. The temperature may be 1700° C. or higher and 1800° C. or lower. When the temperature at which the laminate is heated is 1600° C. or higher and 1900° C. or lower, the solvent in each of the coating films is volatilized such that the conductive layer 4 and the insulating layer 5 can be preferably formed between the first ceramic plate 2 and the second ceramic plate 3. In addition, the first ceramic plate 2 and the second ceramic plate 3 can be preferably joined and integrated through the conductive layer 4 and the insulating layer 5.

A pressure (welding pressure) at which the laminate is pressurized in the thickness direction is freely selected and is preferably 1.0 MPa or more and 50.0 MPa or less, more preferably 3.0 MPa or more and 35.0 MPa or less, and still more preferably 5.0 MPa or more and 20.0 MPa or less.

When the pressure at which the laminate is pressurized in the thickness direction is 1.0 MPa or more and 50.0 MPa or less, the conductive layer 4 and the insulating layer 5 that adhere to each other can be preferably formed between the first ceramic plate 2 and the second ceramic plate 3. In addition, the first ceramic plate 2 and the second ceramic plate 3 can be preferably joined and integrated through the conductive layer 4 and the insulating layer 5.

[Electrostatic Chucking Device]

Hereinafter, an electrostatic chucking device according to an embodiment of the present invention will be described with reference to FIG. 2.

Figure 2:
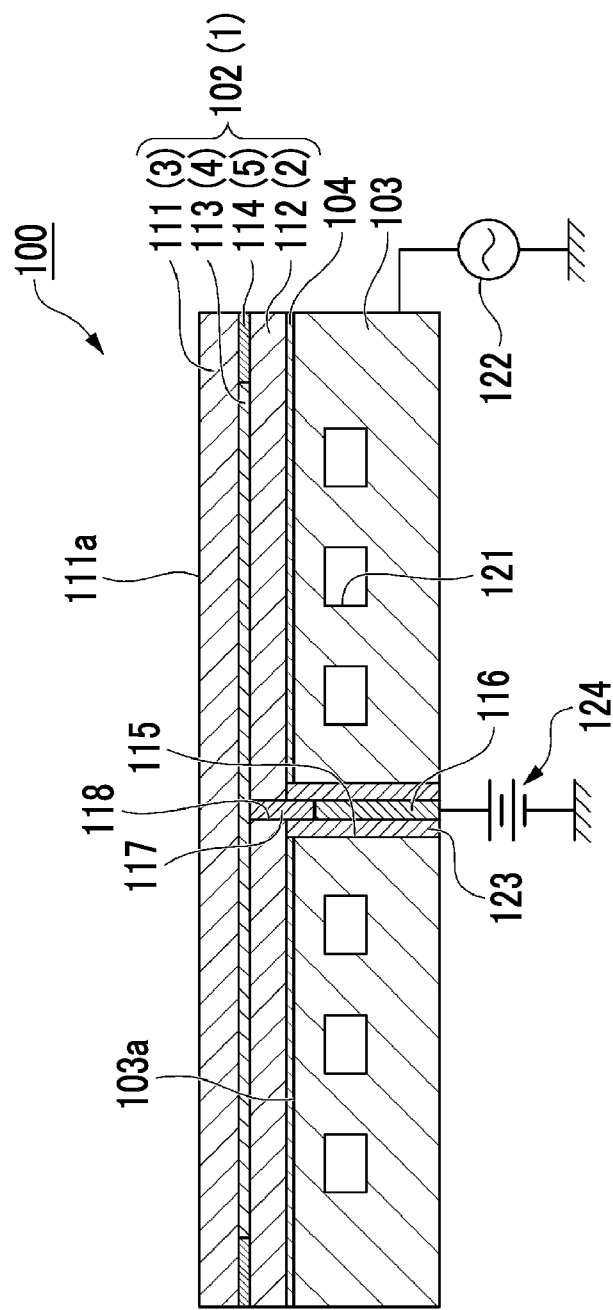
FIG. 2 is a schematic cross-sectional view showing an example of an electrostatic chucking device according to one preferable embodiment of the present invention.

FIG. 2 is a schematic cross-sectional view showing an example of the electrostatic chucking device according to the embodiment. In FIG. 2, the same components as those of the ceramic joined body shown in FIG. 1 are represented by the same reference numerals, and the repeated description thereof will not be repeated.

As shown in FIG. 2, an electrostatic chucking device 100 according to the embodiment includes: a disk-shaped electrostatic chuck member 102; a disk-shaped base member 103 for adjusting a temperature that adjusts the electrostatic chuck member 102 to a desired temperature; and an adhesive layer 104 that joins and integrates the electrostatic chuck member 102 and the base member 103 for adjusting a temperature. In the electrostatic chucking device 100 according to the embodiment, the electrostatic chuck member 102 is, for example, the ceramic joined body 1 1 according to the embodiment. Here, a case where the electrostatic chuck member 102 is the ceramic joined body 1 will be described.

In the following description, a placement surface 111a side of a placement plate 111 is set as "upper side" and the base member 103 for adjusting a temperature is set as "lower side" to represent relative positions of the components.

[Electrostatic Chuck Member]

The electrostatic chuck member 102 includes: a placement plate 111 that is formed of a ceramic and has, as a top surface, the placement surface 111a on which a plate-shaped sample such as a semiconductor wafer is placed; a supporting plate 112 that is provided on a surface side of the placement plate 111 opposite to the placement surface 111a; an electrode 113 for electrostatic adsorption that is interposed between the placement plate 111 and the supporting plate 112; an annular insulating material 114 that surrounds the periphery of the electrode 113 for electrostatic adsorption interposed between the placement plate 111 and the supporting plate 112; and a power feeding terminal 116 that is provided in a fixing hole 115 of the base member 103 for adjusting a temperature to be in contact with the electrode 113 for electrostatic adsorption.

In the electrostatic chuck member 102, the placement plate 111 may correspond to the second ceramic plate 3, the supporting plate 112 may correspond to the first ceramic plate 2, the electrode 113 for electrostatic adsorption may correspond to the conductive layer 4, and the insulating material 114 may correspond to the insulating layer 5.

[Placement Plate]

On the placement surface 111a of the placement plate 111 (second ceramic plate 3), a plurality of protrusions for supporting the plate-shaped sample such as a semiconductor wafer are preferably vertically provided (not shown). Further, in order to prevent leakage of cold gas such as helium (He) in a peripheral portion of the placement surface 111a of the placement plate 111, an annular protrusion having a square shape in cross-section may be provided to surround the peripheral portion. Further, in a region around the annular protrusion on the placement surface 111a, a plurality of protrusions that have the same height as the annular protrusion, have a circular shape in cross-section, and has a substantially rectangular shape in vertical section may be provided. This way, the placement plate 111 can be preferably treated.

The thickness of the placement plate 111 can be freely selected and is preferably 0.3 mm or more and 3.0 mm or less, more preferably 0.4 mm or more and 2.5 mm or less, and still more preferably 0.5 mm or more and 1.5 mm or less. When the thickness of the placement plate 111 is 0.3 mm or more, voltage endurance is excellent. On the other hand, when the thickness of the placement plate 111 is 3.0 mm or less, the electrostatic adsorption force of the electrostatic chuck member 102 does not decrease, thermal conductivity between the plate-shaped sample placed on the placement surface 111a of the placement plate 111 and the base member 103 for adjusting a temperature does not deteriorate, and the temperature of the plate-shaped sample that is being processed can be maintained at a given preferable temperature.

[Supporting Plate]

The supporting plate 112 (first ceramic plate 2) supports the placement plate 111 and the electrode 113 for electrostatic adsorption from the lower side.

The thickness of the supporting plate 112 is preferably 0.3 mm or more and 3.0 mm or less, more preferably 0.4 mm or more and 2.5 mm or less, and still more preferably 0.5 mm or more and 1.5 mm or less. When the thickness of the supporting plate 112 is 0.3 mm or more, a sufficient withstand voltage can be secured. On the other hand, when the thickness of the supporting plate 112 is 3.0 mm or less, the electrostatic adsorption force of the electrostatic chuck member 102 does not decrease, thermal conductivity between the plate-shaped sample placed on the placement surface 111a of the placement plate 111 and the base member 103 for adjusting a temperature does not deteriorate, and the temperature of the plate-shaped sample that is being processed can be maintained at a given preferable temperature.

[Electrode for Electrostatic Adsorption]

In the electrode 113 for electrostatic adsorption (conductive layer 4), by applying a voltage, the electrostatic adsorption force with which the plate-shaped sample is supported on the placement surface 111a of the placement plate 111 is generated.

The thickness of the electrode 113 for electrostatic adsorption can be freely selected and is preferably 5 μm or more and 200 μm or less, more preferably 8 μm or more and 150 μm or less, and still more preferably 10 μm or more and 100 μm or less. The thickness may be 20 μm or more and 80 μm or less or 40 μm or more and 60 μm or less. When the thickness of the electrode 113 for electrostatic adsorption is 5 μm or more, sufficient conductivity can be secured. On the other hand, when the thickness of the electrode 113 for electrostatic adsorption is 200 lam or less, thermal conductivity between the plate-shaped sample placed on the placement surface 111a of the placement plate 111 and the base member 3 for adjusting a temperature does not deteriorate, and the temperature of the plate-shaped sample that is being processed can be maintained at a given desirable temperature. In addition, plasma permeability does not deteriorate, and plasma can be stably generated.

[Insulating Material]

The insulating material 114 (insulating layer 5) surrounds the electrode 113 for electrostatic adsorption to protect the electrode 113 for electrostatic adsorption from corrosive gas and plasma thereof.

Due to the insulating material 114, the placement plate 111 and the supporting plate 112 are joined and integrated through the electrode 113 for electrostatic adsorption.

[Power Feeding Terminal]

The power feeding terminal 116 applies a voltage to the electrode 113 for electrostatic adsorption.

The number, the shape, and the like of the power feeding terminals 116 are freely determined depending on the form of the electrode 113 for electrostatic adsorption, that is, whether the electrode 113 for electrostatic adsorption is unipolar or bipolar.

The material of the power feeding terminal 116 is not particularly limited as long as it is a conductive material having excellent heat resistance. As the material of the power feeding terminal 116, a material having a thermal expansion coefficient similar to those of the electrode 113 for electrostatic adsorption and the supporting plate 112 is preferable. For example, a metal material such as a cobalt alloy or niobium (Nb) and various conductive ceramics are preferably used.

[Conductive Adhesive Layer]

A conductive adhesive layer 117 is provided in the fixing hole 115 of the base member 103 for adjusting a temperature and in a through hole 118 of the supporting plate 112. In addition, the conductive adhesive layer 117 is interposed between the electrode 113 for electrostatic adsorption and the power feeding terminal 116 and electrically connects the electrode 113 for electrostatic adsorption and the power feeding terminal 116 to each other.

A conductive adhesive forming the conductive adhesive layer 117 can be freely selected and preferably includes a conductive material such as carbon fibers or metal powder and a resin.

As the resin in the conductive adhesive, any resin can be freely selected without any particular limitation as long as it suppresses the occurrence of cohesive failure caused by thermal stress. Examples of the resin include a silicone resin, an acrylic resin, an epoxy resin, a phenol resin, a polyurethane resin, and an unsaturated polyester resin.

Among these, a silicone resin is preferably used from the viewpoints that the degree of expansion and contraction is high and cohesive failure caused by a change in thermal stress is not likely to occur.

[Base Member for Adjusting Temperature]

The base member 103 for adjusting a temperature is a disk-shaped thick member formed of at least one of a metal or a ceramic. The body of the base member 103 for adjusting a temperature is configured to function as an internal electrode for generating a plasma. In the body of the base member 103 for adjusting a temperature, a flow path 121 for circulating a coolant such as water, He gas, or $N_2$ gas is formed.

The body of the base member 103 for adjusting a temperature is connected to an external high frequency power supply 122. In addition, in the fixing hole 115 of the base member 103 for adjusting a temperature, the power feeding terminal 116 of which the outer periphery is surrounded by an insulating material 123 is fixed through the insulating material 123. The power feeding terminal 116 is connected to an external direct current power supply 124.

A material forming the base member 103 for adjusting a temperature is not particularly limited as long as it is a metal having excellent thermal conductivity, electrical conductivity, and workability or a compound material including the metal. As the material for forming the base member 3 for adjusting a temperature, for example, aluminum (Al), copper (Cu), stainless steel (SUS), or titanium (Ti) is preferably used.

It is preferable that at least a surface of the base member 103 for adjusting a temperature that is exposed to a plasma undergoes an alumite treatment or is coated with a resin such as a polyimide resin. In addition, it is more preferable that the entire surface of the base member 103 for adjusting a temperature undergoes an alumite treatment or is coated with a resin.

The base member 103 for adjusting a temperature undergoes an alumite treatment or is coated with a resin such that plasma resistance of the base member 103 for adjusting a temperature is improved and abnormal discharge is prevented. Accordingly, the plasma stability of the base member 103 for adjusting a temperature can be improved, and surface scratches of the base member 103 for adjusting a temperature can also be prevented.

[Adhesive Layer]

An adhesive layer 104 is a layer for bonding and integrating an electrostatic chuck portion 102 and a base portion 103 for cooling.

The thickness of the adhesive layer 104 can be freely selected and is preferably 100 μm or more and 200 μm or less and more preferably 130 μm or more and 170 μm or less.

When the thickness of the adhesive layer 104 is in the above-described range, the adhesion strength between the electrostatic chuck portion 102 and the base portion 103 for cooling can be secured. In addition, the thermal conductivity between the electrostatic chuck portion 102 and the base portion 103 for cooling can be sufficiently secured.

A material of the adhesive layer 104 can be freely selected and is formed of, for example, a cured product obtained by thermally curing a silicone resin composition, an acrylic resin, or an epoxy resin.

The silicone resin composition is a silicon compound having a siloxane bond (Si—O—Si) and is a resin having excellent heat resistance and elasticity, which is more preferable.

As the silicone resin composition, in particular, a silicone resin having a thermal curing temperature of 70° C. to 140° C. is preferable.

Here, it is not preferable that the thermal curing temperature is lower than 70° C. because, when the electrostatic chuck portion 102 and the base portion 103 for cooling are joined in a state where they face each other, curing does not progress sufficiently in the process of joining such that the workability may deteriorate. On the other hand, it is not preferable that the thermal curing temperature is higher than 140° C. because a difference in thermal expansion between the electrostatic chuck portion 102 and the base portion 103 for cooling is large and stress between the electrostatic chuck portion 102 and the base portion 103 for cooling increases, which may cause peeling therebetween.

In the electrostatic chucking device 100 according to the embodiment, the electrostatic chuck member 102 is formed of the ceramic joined body 1. Therefore, in the electrostatic chuck member 102, the occurrence of breakdown (discharge) can be suppressed.

Hereinafter, a method for producing the electrostatic chucking device according to the embodiment will be described.

The electrostatic chuck member 102 formed of the ceramic joined body 1 obtained as described above is prepared.

An adhesive formed of a silicone resin composition is applied to a predetermined region of one main surface 103a of the base portion 103 for cooling. Here, the amount of the adhesive applied is adjusted such that the electrostatic chuck portion 102 and the base portion 103 for cooling are joined and integrated.

Examples of a method for applying the adhesive include a method for manually applying the organic adhesive with a spatula, a bar coating method, and a screen printing method.

After applying the adhesive to the main surface 103a of the base portion 103 for cooling, the electrostatic chuck portion 102 (ceramic joined body 1) and the base portion 103 for cooling to which the adhesive is applied are laminated.

In addition, the power feeding terminal 116 that is vertically provided is inserted into the fixing hole 115 that penetrates the base portion 103 for cooling.

Next, the electrostatic chuck portion 102 is pressed against the base portion 103 for cooling at a predetermined pressure such that the electrostatic chuck portion 102 and the base portion 103 for cooling are joined and integrated. As a result, the electrostatic chuck portion 102 and the base portion 103 for cooling are joined and integrated through the adhesive layer 104.

As a result, the electrostatic chucking device 100 according to the embodiment where the electrostatic chuck portion 102 and the base portion 103 for cooling are joined and integrated through the adhesive layer 104 can be obtained.

The plate-shaped sample according to the embodiment is not limited to a semiconductor wafer and may be, for example, a glass substrate for a flat panel display (FPD) such as a liquid crystal display (LCD), a plasma display (PDP), or an organic EL display. In addition, the electrostatic chucking device according to the embodiment may be designed according to the shape or size of the substrate.

EXAMPLES

Hereinafter, the present invention will be described in detail using Examples and Comparative Examples, but is not limited to the following examples.

Example 1

[Preparation of Ceramic Joined Body]

Mixed powder including 91% by mass of aluminum oxide powder and 9% by mass of silicon carbide powder was prepared and was molded and sintered. As a result, a ceramic plate (the first ceramic plate, the second ceramic plate) formed of an aluminum oxide-silicon carbide composite sintered compact (composite body of aluminum oxide and silicon carbide) having a disk shape with a diameter of 450 mm and a thickness of 5.0 mm was prepared.

An arithmetic average roughness (Ra) of one surface (surface in contact with the insulating layer) of the first ceramic plate was adjusted to be 0.2 μm by polishing the one surface of the first ceramic plate. In addition, an arithmetic average roughness (Ra) of one surface (surface in contact with the insulating layer) of the second ceramic plate was adjusted to be 0.2 μm by polishing the one surface (surface in contact with the insulating layer) of the second ceramic plate.

Next, using a screen printing method, a paste for forming a conductive layer was applied to the one surface of the first ceramic plate to form a conductive layer coating film. Next, using a screen printing method, a paste for forming an insulating layer was applied to the one surface of the first ceramic plate to form an insulating layer coating film. The insulating layer coating film and the conductive layer coating film were formed not to overlap each other. In addition, the shape of the conductive layer coating film in a plan view was circular. The insulating layer coating film was formed to surround the outer periphery of the conductive layer. The outer periphery of the insulating layer was the same as the outer periphery of the first ceramic plate. That is, the insulating layer and the first ceramic plate were formed such that the outer peripheries thereof match each other in a plan view. In addition, the thickness of the insulating layer was the same as that of the conductive layer coating film.

As the paste for forming a conductive layer, a paste in which aluminum oxide powder and molybdenum carbide powder were dispersed in isopropyl alcohol was used. In the paste for forming a conductive layer, the content of the aluminum oxide powder was 25% by mass, and the content of the molybdenum carbide powder was 25% by mass. As the paste for forming an insulating layer, a paste in which aluminum oxide powder having an average primary particle diameter of 2.0 μm was dispersed in isopropyl alcohol was used. The content of the aluminum oxide powder in the paste for forming an insulating layer was 50% by mass.

Next, the second ceramic plate was laminated on the conductive layer coating film and the insulating layer coating film such that the polished or ground surface of the second ceramic plate was in contact with surfaces of the conductive layer coating film and the insulating layer coating film opposite to surfaces thereof in contact with the first ceramic plate.

Next, a laminate including the first ceramic plate, the conductive layer coating film, the insulating layer coating film, and the second ceramic plate was pressurized in a thickness direction while being heated in an argon atmosphere. The heat treatment temperature was 1700° C., the welding pressure was 10 MPa, and the time for which the heat treatment and the pressurization were performed was 2 hours.

Through the above-described steps, a ceramic joined body according to Example 1 shown in FIG. 1 was obtained.

(Measurement of Porosity)

In the obtained ceramic joined body, a porosity at an interface between the first ceramic plate and the insulating layer and an interface between the second ceramic plate and the insulating layer was measured. The results are shown in Table 1.

The porosity at the interface between the first ceramic plate and the insulating layer and the interface between the second ceramic plate and the insulating layer was measured as follows. Using a field emission scanning electron microscope (FE-SEM) manufactured by JEOL Ltd., a cut surface of the first ceramic plate, the second ceramic plate, and the insulating layer in the thickness direction was observed. An image of the cut surface was analyzed by image analysis software (Mac-View Version 4, manufactured by MOUN-TECH Co., Ltd.) to calculate the area of pores. A condition of a region used for the analysis was 360 μm×480 μm (insulating layer 5: 15 μm×480 μm, region of ceramic plate 3: 345 μm×480 μm). The measurement region was a region where the second ceramic plate 3 and the insulating layer 5 were in contact with each other.

Based on the calculation result, the porosity (%) is calculated from the following Expression (1) using the area of the insulating layer and the area of the pores.

$$\text{Porosity} = \text{Area of Pores}/(\text{Area of Insulating Layer} + \text{Area of Pores}) \times 100 \quad (1)$$

(Measurement of Average Primary Particle Diameter of Insulating Material)

In the obtained ceramic joined body, an average primary particle diameter of $Al_2O_3$ particles forming the first ceramic plate and the second ceramic plate was measured. In addition, the result of measuring the average primary particle diameter of the insulating material forming the insulating layer (in Table 1, "Average Primary Particle Diameter of $Al_2O_3$ powder (particles)") was 2.0 μm. Further, the result of calculating a ratio of the average primary particle diameter of the $Al_2O_3$ particles forming the insulating layer to the average primary particle diameter of the $Al_2O_3$ particles forming the first ceramic plate and the second ceramic plate (in Table 1, "Ratio between Average primary particle diameters of $Al_2O_3$ powders (Particles)) was 1.3. The results are shown in Table 1.

The average primary particle diameter of the $Al_2O_3$ particles forming the first ceramic plate and the second ceramic plate and the average primary particle diameter of the $Al_2O_3$ particles forming the insulating layer were measured as follows. The obtained ceramic joined body was cut. Using a field emission scanning electron microscope (FE-SEM) manufactured by JEOL Ltd., a cut surface of the first ceramic plate and the second ceramic plate in the thickness direction was observed, and the average particle diameter of 200 particles of the insulating material was obtained as the average primary particle diameter using an intercept method. In the observation, the $Al_2O_3$ particles as the insulating material in the ceramic plate or the insulating layer can be observed, and the average primary particle diameter thereof can be obtained by the observation and the calculation.

(Insulating Characteristics Evaluation)

The insulating characteristics of the ceramic joined body were evaluated as described below.

On a side surface of the ceramic joined body (side surface of the ceramic joined body in the thickness direction), a carbon tape was bonded in contact with the first ceramic plate, the insulating layer, and the second ceramic plate. The conductive layer was surrounded by the insulating layer, and thus was not in contact with the carbon tape.

A through electrode that penetrated the first ceramic plate in the thickness direction and reached the conductive layer from the surface of the first ceramic plate opposite to the surface thereof in contact with the conductive layer was formed. The through electrode was provided in contact with the conductive layer.

A voltage was applied to the ceramic joined body through the carbon tape and the through electrode, and a voltage at which breakdown (discharge) occurred in the ceramic joined body was measured. Specifically, an RF voltage was applied in a state where a voltage of 3000 V was applied, and this state was maintained for 10 minutes. Next, a voltage of 500 V was gradually applied, and this state was maintained for 10 minutes. When the measured current value exceeded 0.1 mA (milliampere), breakdown occurred. The results are shown in Table 1.

Example 2

A ceramic joined body according to Example 2 was obtained using the same method as that of Example 1, except that the arithmetic average roughness (Ra) of one surface of the first ceramic plate and one surface of the second ceramic plate was adjusted to be 0.07 μm.

Using the same method as that of Example 1, the porosity of the ceramic joined body according to Example 2 and the average primary particle diameter of the $Al_2O_3$ particles were measured, and the insulating characteristics were evaluated. The results are shown in Table 1.

Example 3

A ceramic joined body according to Example 3 was obtained using the same method as that of Example 1, except that the arithmetic average roughness (Ra) of one surface of the first ceramic plate and one surface of the second ceramic plate was adjusted to be 0.01 μm.

Using the same method as that of Example 1, the porosity of the ceramic joined body according to Example 3 and the average primary particle diameter of the $Al_2O_3$ particles were measured, and the insulating characteristics were evaluated. The results are shown in Table 1.

Example 4

Mixed powder including 95.5% by mass of aluminum oxide powder and 4.5% by mass of silicon carbide powder was molded and sintered. As a result, a ceramic plate (the first ceramic plate, the second ceramic plate) formed of an aluminum oxide-silicon carbide composite sintered compact having a disk shape with a diameter of 450 mm and a thickness of 5.0 mm was prepared.

A ceramic joined body according to Example 4 was obtained using the same method as that of Example 1, except that the average primary particle diameter of the $Al_2O_3$ particles forming the insulating layer was adjusted to be 3.0 μm and the ratio of the average primary particle diameter of the $Al_2O_3$ particles forming the insulating layer to the average primary particle diameter of the $Al_2O_3$ particles forming the first ceramic plate and the second ceramic plate was 2.0.

Using the same method as that of Example 1, the porosity of the ceramic joined body according to Example 4 and the average primary particle diameter of the $Al_2O_3$ particles were measured, and the insulating characteristics were evaluated. The results are shown in Table 1.

Example 5

A ceramic joined body according to Example 5 was obtained using the same method as that of Example 4, except that the average primary particle diameter of the $Al_2O_3$ particles forming the insulating layer was adjusted to be 3.3 μm, the ratio of the average primary particle diameter of the $Al_2O_3$ particles forming the insulating layer to the average primary particle diameter of the $Al_2O_3$ particles forming the first ceramic plate and the second ceramic plate was 2.2, and the heat treatment temperature of the laminate including the first ceramic plate, the conductive layer coating film, the insulating layer coating film, and the second ceramic plate was 1750° C.

Using the same method as that of Example 1, the porosity of the ceramic joined body according to Example 5 and the average primary particle diameter of the $Al_2O_3$ particles were measured, and the insulating characteristics were evaluated. The results are shown in Table 1.

Example 6

A ceramic joined body according to Example 6 was obtained using the same method as that of Example 4, except that the average primary particle diameter of the $Al_2O_3$ particles forming the insulating layer was adjusted to be 5.8 μm, the ratio of the average primary particle diameter of the $Al_2O_3$ particles forming the insulating layer to the average primary particle diameter of the $Al_2O_3$ particles forming the first ceramic plate and the second ceramic plate was 3.9, and the heat treatment temperature of the laminate including the first ceramic plate, the conductive layer coating film, the insulating layer coating film, and the second ceramic plate was 1800° C.

Using the same method as that of Example 1, the porosity of the ceramic joined body according to Example 6 and the average primary particle diameter of the $Al_2O_3$ particles were measured, and the insulating characteristics were evaluated. The results are shown in Table 1.

Comparative Example 1

A ceramic joined body according to Comparative Example was obtained using the same method as that of Example 1, except that the arithmetic average roughness (Ra) of one surface of the first ceramic plate and one surface of the second ceramic plate was adjusted to be 0.3 μm.

Using the same method as that of Example 1, the porosity of the ceramic joined body according to Comparative Example and the average primary particle diameter of the $Al_2O_3$ particles were measured, and the insulating characteristics were evaluated.

The results are shown in Table 1.

Comparative Example 2

A ceramic joined body according to Comparative Example 2 was obtained using the same method as that of Example 1, except that the average primary particle diameter of the $Al_2O_3$ particles forming the insulating layer was adjusted to be 1.5 μm, the ratio of the average primary particle diameter of the $Al_2O_3$ particles forming the insulating layer to the average primary particle diameter of the $Al_2O_3$ particles forming the first ceramic plate and the second ceramic plate was 1.0, and the heat treatment temperature of the laminate including the first ceramic plate, the conductive layer coating film, the insulating layer coating film, and the second ceramic plate was 1650° C.

Using the same method as that of Example 1, the porosity of the ceramic joined body according to Comparative Example 2 and the average primary particle diameter of the $Al_2O_3$ particles were measured, and the insulating characteristics were evaluated. The results are shown in Table 1.

Comparative Example 3

A ceramic joined body according to Comparative Example 3 was obtained using the same method as that of Example 1, except that the average primary particle diameter of the $Al_2O_3$ particles forming the insulating layer was adjusted to be 1.0 μm, the ratio of the average primary particle diameter of the $Al_2O_3$ particles forming the insulating layer to the average primary particle diameter of the $Al_2O_3$ particles forming the first ceramic plate and the second ceramic plate was 0.7, and the heat treatment temperature of the laminate including the first ceramic plate, the conductive layer coating film, the insulating layer coating film, and the second ceramic plate was 1600° C.

Using the same method as that of Example 1, the porosity of the ceramic joined body according to Comparative Example 3 and the average primary particle diameter of the $Al_2O_3$ particles were measured, and the insulating characteristics were evaluated. The results are shown in Table 1.

TABLE 1

|  | Heat Treatment Temperature [° C.] | Arithmetic Average Roughness (Ra) [μm] | Porosity [%] | Average Primary Particle Diameter of $Al_2O_3$ Powder [μm] | Ratio between Average Primary Particle Diameters of $Al_2O_3$ Powders | Breakdown Voltage [kV/mm] |
| --- | --- | --- | --- | --- | --- | --- |
| Example 1 | 1700 | 0.2 | 3.0 | 2.0 | 1.3 | 8 |
| Example 2 | 1700 | 0.07 | 2.1 | 2.0 | 1.3 | 18 |
| Example 3 | 1700 | 0.01 | 1.0 | 2.0 | 1.3 | 19 |
| Example 4 | 1700 | 0.2 | 3.0 | 3.0 | 2.0 | 9 |
| Example 5 | 1750 | 0.2 | 3.0 | 3.3 | 2.2 | 18 |
| Example 6 | 1800 | 0.2 | 3.0 | 5.8 | 3.9 | 19 |
| Comparative Example 1 | 1700 | 0.3 | 4.5 | 2.0 | 1.3 | 4 |
| Comparative Example 2 | 1650 | 0.2 | 3.0 | 1.5 | 1.0 | 3.5 |
| Comparative Example 3 | 1600 | 0.2 | 3.0 | 1.0 | 0.7 | 0.5 |

It was found from the results of Table 1 that, although the breakdown voltage in the ceramic joined body according to Comparative Example 1 where the porosity was 4.5% (more than 4%) was low, the breakdown voltage in the ceramic joined bodies according to Examples 1 to 6 where the porosity was 3.0% or less was high.

In addition, it was found that, in the ceramic joined bodies according to Comparative Examples 2 and 3 where the ratio of the average primary particle diameter of the $Al_2O_3$ particles forming the insulating layer to the average primary particle diameter of the $Al_2O_3$ particles forming the ceramic plate was 1.0 or less, the breakdown voltage was low. On the other hand, it was found that, in the ceramic joined bodies according to Examples 1 to 6 where the ratio of the average primary particle diameter of the $Al_2O_3$ particles forming the insulating layer to the average primary particle diameter of the $Al_2O_3$ particles forming the ceramic plate was more than 1, the breakdown voltage was high.

INDUSTRIAL APPLICABILITY

The present invention provides a ceramic joined body in which the occurrence of breakdown (discharge) is suppressed at a joint interface between a ceramic plate and a conductive layer, an electrostatic chucking device, and a method for producing the ceramic joined body. In the ceramic joined body according to the present invention, the porosity at the interface between the pair of ceramic plates and the insulating layer is 4% or less, and the ratio of the average primary particle diameter of the insulating material forming the insulating layer to the average primary particle diameter of the insulating material forming the ceramic plates is more than 1. Therefore, the occurrence of breakdown (discharge) is suppressed at a joint interface between the ceramic plate and the conductive layer. Accordingly, the ceramic joined body according to the present invention is suitably used for an electrostatic chuck member of an electrostatic chucking device, and the usefulness thereof is significantly high.

REFERENCE SIGNS LIST

1: ceramic joined body
2: ceramic plate (first ceramic plate)
2a: one surface of first ceramic plate
3: ceramic plate (second ceramic plate)
3a: one surface of second ceramic plate
4: conductive layer
5: insulating layer
6: pore
100: electrostatic chucking device
102: electrostatic chuck member
103: base member for adjusting a temperature (base portion for cooling)
103a: one main surface of base portion for cooling
104: adhesive layer
111: placement plate
111a: placement surface of placement plate
112: supporting plate
113: electrode for electrostatic adsorption
114: insulating material
115: fixing hole
116: power feeding terminal
117: conductive adhesive layer
118: through hole
121: flow path
122: high frequency power supply
123: insulating material
124: direct current power supply

The invention claimed is:

1. A ceramic joined body comprising:
a pair of ceramic plates that include a conductive material and an insulating material, and
a conductive layer and an insulating layer that are interposed between the pair of ceramic plates,
wherein the conductive layer is formed of a conductive material and an insulating material,
the insulating layer is formed of an insulating material,
a porosity at an interface between the pair of ceramic plates and the insulating layer is 4% or less,
a ratio of an average primary particle diameter of the insulating material which forms the insulating layer to an average primary particle diameter of the insulating material of the pair of ceramic plates is more than 1, and
wherein the insulating materials which are included in the conductive layer and the insulating layer consist of aluminum oxide.

2. The ceramic joined body according to claim 1,
wherein an average primary particle diameter of the insulating material which forms the insulating layer is 1.6 μm or more and 10.0 μm or less.

3. The ceramic joined body according to claim 1,
wherein the ceramic plate is formed of a composite body of aluminum oxide and silicon carbide.

4. The ceramic joined body according to claim 1,
wherein the conductive material which is included in the conductive layer is at least one selected from the group consisting of $Mo_2C$, Mo, WC, W, TaC, Ta, SiC, carbon black, carbon nanotubes, and carbon nanofibers.

5. The ceramic joined body according to claim 1,
wherein the conductive layer is in direct contact with and is interposed between the pair of ceramic plates, and
the insulating layer is in direct contact with and is interposed between the pair of ceramic plates.

6. The ceramic joined body according to claim 1,
wherein the insulating layer is disposed on an outer periphery of the conductive layer,
the ceramic plate is formed of a composite body of aluminum oxide and silicon carbide,
the conductive layer is formed of aluminum oxide and molybdenum carbide, and
the insulating layer is formed of aluminum oxide.

7. An electrostatic chucking device,
wherein an electrostatic chuck member formed of a ceramic and a base member for adjusting a temperature formed of a metal are joined through an adhesive layer, and
the electrostatic chuck member is formed of the ceramic joined body according to claim 1.

8. A method for producing the ceramic joined body according to claim 1, comprising:
a step of preparing a first ceramic plate including a conductive material and a second ceramic plate including a conductive material;
a step of adjusting an arithmetic average roughness (Ra) of one surface of the first ceramic plate to be 0.25 μm or less by grinding or polishing the one surface of the first ceramic plate;
a step of applying a paste for forming a conductive layer to the processed one surface of the first ceramic plate to form a conductive layer coating film;
a step of applying a paste for forming an insulating layer to the processed one surface of the first ceramic plate to form an insulating layer coating film;
a step of adjusting an arithmetic average roughness (Ra) of one surface of the second ceramic plate to be 0.25 μm or less by grinding or polishing the one surface of the second ceramic plate;
a step of laminating the second ceramic plate on the conductive layer coating film and the insulating layer coating film so that the processed one surface of the second ceramic plate is in contact with surfaces of the conductive layer coating film and the insulating layer coating film, wherein the surfaces of the films are located on a side opposite to surfaces of the films which are in contact with the first ceramic plate; and
a step of pressurizing a laminate including the first ceramic plate, the conductive layer coating film, the insulating layer coating film, and the second ceramic plate in a thickness direction while heating the laminate.

9. The method for producing a ceramic joined body according to claim 8,
wherein the step of forming the insulating layer coating film is performed after the step of forming the conductive layer coating film.

10. The method for producing a ceramic joined body according to claim 8,
wherein the step of forming the insulating layer coating film is performed before the step of forming the conductive layer coating film.

* * * * *